United States Patent [19]

Bohling et al.

[11] Patent Number: 4,988,640
[45] Date of Patent: Jan. 29, 1991

[54] METHOD OF DOPING AND IMPLANTING USING ARSINE, ANTIMONY, AND PHOSPHINE SUBSTITUTES

[75] Inventors: David A. Bohling, Macungie; Gregory T. Muhr, Allentown, both of Pa.; David A. Roberts, Carlsbad, Calif.

[73] Assignee: Air Products and Chemicals, Inc., Allentown, Pa.

[21] Appl. No.: 433,080

[22] Filed: Nov. 6, 1989

Related U.S. Application Data

[62] Division of Ser. No. 224,089, Jul. 25, 1988, Pat. No. 4,904,616.

[51] Int. Cl.$^5$ .................. H01L 21/20; H01L 21/265
[52] U.S. Cl. .......................... 437/81; 148/DIG. 41; 148/DIG. 83; 437/101; 437/233; 437/930; 437/959; 437/967
[58] Field of Search .................. 148/DIG. 16, 41, 56, 148/65, 76, 83, 84, 85, 110, 119, 122, 69; 156/610–614; 556/70; 427/248.1, 255.1, 252, 253; 437/20, 81, 101, 85, 88, 105, 107, 126, 133, 233, 930, 936, 914, 951, 959, 967

[56] References Cited

U.S. PATENT DOCUMENTS

| | | | |
|---|---|---|---|
| 2,750,541 | 6/1956 | Ohl | 317/235 |
| 2,787,564 | 4/1957 | Shockley | 437/20 |
| 2,842,466 | 7/1988 | Moyer | 437/20 |
| 4,721,683 | 1/1988 | Ward | 437/38 |
| 4,734,514 | 3/1988 | Melas et al. | 556/70 |
| 4,800,173 | 1/1989 | Kanai et al. | 437/81 |
| 4,877,753 | 10/1989 | Freeman | 437/101 |

FOREIGN PATENT DOCUMENTS

0206764 6/1982 European Pat. Off.

OTHER PUBLICATIONS

S. J. W. Price et al, "The Pyrolysis of Trimethylarsine", *Canadian Journal Chemistry*, vol. 48, (1970), pp. 3209–3212.

P. B. Ayscough et al, "Kinetics of the Pyrolysis of Trimethylarsine, Tristrifluoromethylarsine and Related Compounds: *Journal of the Chemical Society*," (1954) pp. 3381–3388.

G. R. A. Brandt, et al., "Organometallic and Organometalloidal Fluorine Compounds Part V, Trifluoromethyl Compounds of Arsenic" *Journal of the Chemical Society*, 1952, pp. 2552–2555.

H. J. Emeleus, et al., "Organometallic and Organometalloidal Fluorine Compounds, Part VI, Trifluoromethyl Arsenicals", *Journal of the Chemical Society*, 1952, pp. 1552–1564.

F. W. Bennett, et al., "Organometallic and Organometalloidal Fluorine Compounds, Part VIII, Trifluoromethyl Compounds of Phosphorus", *Journal of the Chemical Society*, 1953, pp. 1565–1571.

W. R. Cullen, "Perfluoroalkyl Arsenicals, Part I The Preparation of Alkyl Perfluoroalkyl Arsenicals", *Canadian Journal of Chemistry* vol. 38, 1960, pp. 439–443.

W. R. Cullen, "Perfluoroalkyl Arsenicals, Part II The Preparation and Properties of Aryl Perfluoroalkyl Arsenicals", *Canadian Journal of Chemistry*, vol. 38, 1960, pp. 445–451.

M. J. Ludowise, et al. "Use of Column V Alkyls in Organometallic Vapor Phase Epitaxy (OMVPE)", *SPIE*, vol. 323, 1982, pp. 117–124.

M. J. Cherng, et al., "GaAs$_{1-x}$Sb$_x$ Growth by OMVPE" *Journal of Electronic Materials*, vol. 13, No. 5, 1984, pp. 799–813.

D. M. Speckman, et al., "Alternatives to Arsine; The Atmospheric Pressure Organometallic Chemical Vapor Deposition Growth of GaAs Using Triethylarsenic" *Applied Physics Letter*, vol. 50 (11) 3/16/87, pp. 676–678.

C. H. Chen, et al., "Use of Tertiary Butyl Arsine for GaAs Growth" *Applied Physics Letter*, vol. 50(4) 1/26/87, pp. 218–220.

R. M. Lum, et al., "Use of Tertiary Butyl Arsine in the Metal Organic Chemical Vapor Deposition Growth of GaAs", *Applied Physics Letter*, vol. 50(5) 2/2/87, pp. 284–286.

M. J. Cherny, et al., "MOVPE Growth of GaInAsS", *Journal of Crystal Growth* 77 (1986), pp. 408–417.

(List continued on next page.)

*Primary Examiner*—Olik Chaudhuri
*Assistant Examiner*—William D. Bunch
*Attorney, Agent, or Firm*—Geoffrey L. Chase; James C. Simmons; William F. Marsh

[57] ABSTRACT

The present invention addresses the use of at least partially fluorinated organometallic compounds in reactive deposition applications. More specifically, the present invention addresses the use of the fluoroorganometallic compounds $M(CF_3)_3$, or any $M(C_nF_{(2n+1)})_{3-y}H_y$ compound where ($y \leq 2$), $M(CH_2CF_3)_3$ or any fluoroalkyl organometallics of the general formula $M(C_nH_{[(2n+1)-x]}F_x)_{3-y}H_y$, where $y \leq 2$; x has a value $1 \leq x \leq 2n+1$; and M=As, P, or Sb, in processes requiring deposition of the corresponding element. These uses include a number of different processes; the organometallic vapor phase epitaxy of compound semiconductor materials such as GaAs, InP, AlGaAs, InSb, etc. doping of $SiO_2$ or borosilicate based glasses to enhance the reflow properties of the glass; in-situ n-type doping of silicon epitaxial material; sourcing of arsenic or phosphorus for ion implantation; chemical beam epitaxy and diffusion doping into electronic materials such as silicon dioxide, silicon and polycrystalline silicon. These types of materials generally have high volatilities, low toxicities, labile metal-ligand bonds, and stable decomposition products.

Specifically, the use of tris-trifluoromethyl arsenic $(As(CF_3)_3)$ as a substitute for arsine in the manufacture of silicon integrated circuits, Group III-V compound semiconductors, optoelectronics and other electronic devices has been identified.

16 Claims, No Drawings

OTHER PUBLICATIONS

G. J. Bourgnot, et al., "Growth of $Ga_{1-x}Al_xSb$ and $Ga_{1-x}In_xSb$ by Organometallic Chemical Vapor Deposition", *Journal of Crystal Growth* pp. 392-399.

R. M. Biefield, "The Preparaton of $InAs_{1-x}Sb_x$ Alloys and Strained-Layer Super-Lattices by MOCVD", *Journal of Crystal Growth* 77 (1986) pp. 400-407.

James H. Comfort, et al, "In-situ Arsenic Doping of Epitaxial Silicon at 800° C. by Plasma Enhanced Chemical Vapor Deposition", *Applied Physics Letter*, 51(19), 11/9/87, pp. 1536-1538.

Jacques S. Mercier, "Rapid Flow of Doped Glasses for VLSIC Fabrication", *Solid State Technology*, Jul. 1987, pp. 85-91.

R. M. Lum, et al., "Investigation of Carbon Incorporation in GaAs using C-enriched Trimethylarsenic and $^{13}CH_4$", *Journal of Electronic Materials*, vol. 17 No. 2 (1988) pp. 101-104.

R. M. Lum, et al., "Investigation of Triethylarsenic as a Replacement for Arsine in the Metal-organic Chemical Vapor Deposition of GaAs", *Applied Physics Letter*, vol. 52, (18) 5/2/88.

A. Tromsom Carli, et al., "Metal Organic Vapour Phase Epitaxy of GaAs; Raman Studies of Complexes Formation", *Revue Physical Applications*, vol. 20 (1985) pp. 569-574.

J. C. C. Tsai, "Diffusion", (Chapter 5), *VLSI Technology*, edited by SZE, pp. 169-217, (1983).

B. Swamira, et al., "Diffusion of Arsenic in Polycrystalline Silicon", *Applied Physic Letter*, 40(a), May 1982, pp. 795-798.

T. Kook, et al., "Diffusion of Dopants in (111) Silicon During High Temperature Heat Treatment in Nitrogen", *Material Research Society Symposium Proc.*, vol. 36 (1985), pp. 83-88.

W. T. Tang, "Chemical Beam Epitoxy of InGaAs" *Journal of Applied Physics*, 58(3), Aug. 1985, pp. 1415-1418.

H. Kroemer, "MBE Growth of GaAs on Si. Problems and Progress", *Materials Research Society Symposium Proceeding*, (67), (1986), pp. 3-14.

W. T. Tsang, "Chemical Beam Epitoxy of InP and GaAs," *Applied Physics Letter*, vol. 45, No. 11, 12/1/84, pp. 1234-1236.

N. J. Mason, "Metal-Organic Vapour Phase Epitaxy", *Chemistry of the Semiconductor Industry*, pp. 140-155.

"Doping and Autodoping", *VLSI Technology*, pp. 56-61.

"Ion Implantation", *Encyclopedia of Semiconductor Technology*, pp. 397-410, John Wiley & Sons.

"Ion Implantation", *Consise Encyclopedia of Chemical Technology*, p. 666, John Wiley & Sons.

METHOD OF DOPING AND IMPLANTING USING ARSINE, ANTIMONY, AND PHOSPHINE SUBSTITUTES

This is a division of application Ser. No. 224,089, filed July 25, 1988, now U.S. Pat. No. 4,904,616.

TECHNICAL FIELD

The present invention is directed to methods for reactive deposition of selected Group VA metals using improved sources of such metal which lower toxicity and alleviate inadvertent contamination of end products. More specifically, the present invention is a method for supplying arsenic, phosphorus or antimony for epitaxial compositions, doping of glasses, n-type doping of silicon substrates, ion implantation, and diffusion.

BACKGROUND OF THE PRIOR ART

Arsenic and phosphorus compounds which are used in doping and thin film deposition processes in the manufacture of silicon and compound semiconductor devices are extremely toxic and present handling hazards in their storage, distribution and use. For example arsine which is extensively used in doping operations for the manufacture of silicon integrated circuits and in the deposition of arsenic in chemical vapor deposition processes associated with the manufacture of gallium-arsenic devices is one of the most toxic substances known to man. It has a Lowest Concentration (LC50), wherein 50% of a sample population dies, of approximately 5 ppm translating to a Threshold Limit Value, which is the highest level allowed by law for an 8 hour workday, (TLV) of 50 ppb. Arsine is shipped and stored as a high pressure gas, which increases its potential hazard as an atmospheric contaminant. Because of this toxicity, extensive safety precautions and fail-safe equipment must be built in to processes where arsine is used. Additionally, local and national environmental laws and regulations are being enacted to further control arsine's use, shipment and storage.

In order to avoid the toxicity problems associated with arsine and phosphine, alkyl Group V organometallics have been used as sources for these corresponding elements. Tertiary butyl arsine ($H_2As[t-C_4H_9]$), diethylarsine ($HAs[C_2H_5]_2$), and trimethylarsine ($As[CH_3]_3$) have been tested as arsine substitutes. These materials are somewhat less toxic than arsine. Tertiary butyl arsine has a Threshold Limit Value (TLV) equal to 80 ppb and a Lowest Concentration (LC50) equal to 70 ppm. Toxicity trends generally decrease with increased alkyl substitution. These materials will deposit arsenic in chemical vapor deposition processes, but are less desirable because they co-deposit carbon which is detrimental to the electrical performance of the final device.

Decomposition of Group VA organometallic and fluorinated derivatives are reported by S. J. W. Price et al, "The Pyrolysis of Trimethylarsine", *Canadian Journal Chemistry*, vol. 48, (1970) pp 3209-3212; and by P. B. Ayscough et al, "Kinetics of the Pyrolysis of Trimethylarsine, Tristrifluoromethylarsine and Related Compounds; *Journal of the Chemical Society*, (1954) pp 3381-3388.

In ion implantation doping applications, arsenic metal is sometimes used as the source. Heated to temperatures sufficient for sublimation, the vapor is directed to the implanter. However a more volatile source is usually preferred and arsine is still used in most applications.

U.S. Pat. No. 4,734,514 is directed to the use of hydrocarbon-substituted analogs of phosphine and arsine for various depositions and doping techniques.

Published European Patent Application No. 0 206 764 discloses techniques for doping glass to produce arseno-silicate glass. The glass is used as waveguide material.

G. R. A. Brandt, et al. in an article "Organometallic and Organometalloidal Fluorine Compounds Part V. Trifluoromethyl Compounds of Arsenic", *Journal of the Chemical Society*, 1952, pg. 2552-2555, reported the interaction of arsenic and trifluoroiodomethane to produce tris-trifluoromethylarsine and idobistrifluoromethylarsine.

H. J. Emeleus, et al. in an article "Organometallic and Organometalloidal Fluorine Compounds, Part VI, Trifluoromethyl Arsenicals", *Journal of the Chemical Society*, 1952, pg. 1552-1564, reports the reactions of various trifluoromethyl arsenicals to prepare the corresponding halides and related compounds. The article reports the decomposition of bis-trifluoromethylarsine to tris-trifluoromethylarsenic, arsenic metal and fluoroform. Tris-trifluoro-methylarsine was also subjected to ultraviolet light in a silica tube which resulted in a film of arsenic deposited in the cooler portions of the tube.

F. W. Bennett, et al. reported in an article "Organometallic and Organometalloidal Fluorine Compounds, Part VII, Trifluoromethyl Compounds of Phosphorus", *Journal of the Chemical Society*, 1953, pg. 1565-1571, the interaction of phosphorus and trifluoroidomethane resulted in tris-trifluoromethylphosphine.

W. R. Cullen in an article "Perfluoroalkyl Arsenicals, Part I The Preparation of Alkyl Perfluoroalkyl Arsenicals", reported in *Canadian Journal of Chemistry*, Volume 38, 1960, pg. 439-443, describes the reaction of tetramethyldiarsine with trifluoroidomethane to give dimethyltrifluoromethylarsine.

W. R. Cullen in an article "Perfluoroalkyl Arsenicals, Part II The Preparation and Properties of Aryl Perfluoroalkyl Arsenicals", reported in *Canadian Journal of Chemistry*, Volume 38, 1960, pg. 445-451, describes the reaction of iododiphenylarsine with trifluoroiodomethane to produce diphenyltrifluoromethylarsine. Thermal decomposition of diphenyltrifluoromethylarsine resulted in undisclosed black solid deposit.

In an article by M. J. Ludowise, et al. entitled "Use of Column V Alkyls in Organometallic Vapor Phase Epitaxy (OMVPE)", reported in *SPIE*, Volume 323, Semiconductor growth technology "1982", pg. 117 thru 124, the use of trimethylarsenic and trimethylantimony for deposition of Group III-V compound semiconductors is discussed. Specifically the organometallic vapor phase epitaxial reaction deposition of trialkyl aluminum, gallium and indiums with trialkyl and hydrides of nitrogen, phosphorus, antimony and arsenic are disclosed.

In an article by M. J. Cherng, et al. entitled "$GaAs_{1-x}Sb_x$ Growth by OMVPE", reported in *Journal of Electronic Materials*, Volume 13, No. 5, 1984, pgs. 799 thru 813, the methods for organometallic vapor phase epitaxy using trimethyl gallium, antimony, and arsenic as source materials are disclosed. Much of the experimental results reported in the article were derived from using trimethylarsenic in contrast to arsine.

In an article by D. M. Speckman, et al. entitled "Alternatives to Arsine: the Atmospheric Pressure Organometallic Chemical Vapor Deposition Growth of GaAs Using Triethylarsenic", reported in *Applied Physics Letter*, Volume 50 (11), 16 Mar. 1987, pg. 676-678, the problem of reactant toxicity and carbon impurity contamination is highlighted in a discussion of the homoepitaxial growth of gallium arsenide layers by organometallic chemical vapor deposition. The traditional use of arsine and trimethyl gallium is contrasted with the more beneficial use of triethyl gallium. The use of triethyl gallium tends to reduce the amount of incorporated carbon into the epitaxial film.

In an article by C. H. Chen, et al. entitled "Use of Tertiary Butyl Arsine for GaAs Growth", reported in *Applied Physics Letter*, Volume 50 (4), 26 Jan. 1987, pg. 218-220, the substitution of tertiary butyl arsine as a new organometallic source in replacement of arsine which results in improved organometallic vapor phase epitaxial growth with diminished carbon incorporation into the gallium arsenic layer while diminishing hazards of toxicity, purity and storage in comparison to arsine was reported.

R. M. Lum, et al., in an article entitled "Use of Tertiary Butyl Arsine in the Metal Organic Chemical Vapor Deposition Growth of GaAs", reported in *Applied Physics Letter*, Volume 50 (5), 2 Feb. 1987, pg. 284-286, again discuss the benefits of using tertiary butyl arsine in reactions to form epitaxial films of gallium-arsenic. The results are identified as being more beneficial than using an arsenic source of trimethylarsenic.

M. J. Cherny, et al., in *Journal of Crystal Growth*, 77, (1986), pp. 408-417, "MOVPE Growth of GaInAsSb", describe the use of trimethyl compounds to make the name product. Similar disclosures were made at page 392-399 of the publication by G. J. Bougnot, et al. in "Growth of $Ga_{1-x}Al_x$ Sb and $Ga_{1-x}In_xSb$ by Organometallic Chemical Vapor Deposition", and at page 400-407 by R. M. Biefield in "The Preparation of $InAs_{1-x}Sb_x$ Alloys and Strained-Layer Super-lattices by MOCVD."

In an article by James H. Comfort, et al. entitled "In-situ Arsenic Doping of Epitaxial Silicon at 800° C. by Plasma Enhanced Chemical Vapor Deposition" appearing in *Applied Physics Letter*, 51(19), 9 Nov. 1987, pages 1536-1538, a discussion is presented of the arsenic doping of epitaxial silicon films using chemical vapor deposition wherein arsine is the source of the arsenic doping.

In an article by Jacques S. Mercier entitled "Rapid Flow of Doped Glasses for VLSIC Fabrication" appearing in *Solid State Technology*, July 1987, pages 85-91, a report on doping of phosphosilicate glass and borophosphosilicate glass was given. The effects of flow of such glass on electronic devices is specifically identified.

In an article by R. M. Lum, et al. entitled "Investigation of Carbon Incorporation in GaAs using $^{13}C$-enriched trimethylarsenic and $^{13}CH_4$", appearing in *Journal of Electronic Materials*, Vol. 17, No. 2, (1988), pp. 101-104, it was reported that increased occurrences of carbon impurity contamination of chemical vapor depositions of gallium arsenide are achieved when the less toxic trimethylarsenic is used in place of arsine.

In another article by R. M. Lum, et al. entitled "Investigation of Triethylarsenic as a Replacement for Arsine in the Metal-organic Chemical Vapor Deposition of GaAs", appearing in *Applied Physics Letter*, Vol. 52, (18) May 2, 1988, the use of the named arsenic compound was discussed, but problems with carbon deposition were noted.

In an article by A. Tromsom Carli, et al. entitled "Metal Organic Vapour Phase Epitaxy of GaAs: Raman Studies of Complexes Formation", reported in *Revue Physical Applications*, Volume 20 (1985), pgs. 569-574, the use of trimethyl arsenic in place of arsine in a metal organic vapor phase epitaxy to produce gallium-arsenic was described. The article summarizes sources of contamination in epitaxial electronic layers, wherein such contamination includes carbon, silicon and zinc.

In U.S. Pat. No. 4,721,683, tertiary alkyl phosphine and arsine compounds are disclosed to have utility for semiconductor ion implantation.

In Chapter 5 from *VLSI Technology*, edited by Sze, pp 169-217, (1983), diffusion applications are described in detail. Diffusion sources of phosphorus are generally implanted, but can be vapor sourced from $P_2O_5$. Arsine diffusion sources are generally ion implanted. Diffusion was further described in B. Swaminathan, et al. "Diffusion of Arsenic In Polycrystalline Silicon", *Applied Physics Letter*, 40(a) May 1982, pp 795-798; and in T. Kook et al "Diffusion of Dopants in (111) Silicon During High Temperature Heat Treatment in Nitrogen", *Material Research Society Symposium Proc.*, Vol 36, (1985) pp 83-88.

Chemical beam epitaxy is a specialized form of epitaxial growth which has been shown to be amenable to organometallic source materials. Such demonstrations are found in W. T. Tsang, "Chemical Beam Epitaxy of InP and GaAs", *Applied Physics Letter*, vol. 45, No. 11, 1 Dec. 1984 pp 1234-1236; W. T. Tsang, "Chemical Beam Epitaxy of InGaAs", *Journal of Applied Physics*, 53(3), Aug. 1985, pp. 1415-1418, and H. Kroemer, "MBE Growth of GaAs on Si. Problems and Progress", *Material Research Society Symposium Proceedings*, (67), (1986), pp 3-14.

Arsine and phosphine are used extensively in organometallic vapor phase epitaxy of Group III-V compound semiconductor materials. Typically in this technique, a metal alkyl organometallic compound such as trimethyl aluminum, trimethyl indium, and/or trimethyl gallium (or other alkyl sources such as the corresponding ethyl compounds) is combined with the hydride of arsenic or phosphorus at high temperature to form single crystal (epitaxial) AlGaAs, InGaAs, InP, or GaAs, or any other mixed compound semiconductor material. Arsine is also used extensively as an n-type dopant in the epitaxial growth of silicon electronic materials, or cracked and implanted, using ion implanters, into silicon device structures. Phosphorous is used in the production of BPSG (borophosphosilicate glass) and PSG (phosphosilicate glass) glass, and similarly arsine can be used for ASG (arsenosilicate glass), to enhance reflow properties of the glass. In all these cases, arsine and phosphine are the volatile carriers of arsenic and phosphorus to the appropriate material or process.

Arsine is known to be a highly toxic material, with a Threshold Limit Value (TLV) of 0.05 ppm and a toxic limit near 5 ppm. Phosphine is not quite as toxic as arsine, but is still highly hazardous with a TLV of 5 ppm. Both are high pressure compressed gases under normal use conditions, or are supplied as high pressure mixtures in hydrogen. One of the major costs in performing Organometallic Vapor Phase Epitaxy (OMVPE), are costs associated with the installation of safety systems, including high efficiency ventilation systems, elaborate detection and alarm systems, isolated gas storage facilities, emergency purge systems and elaborate gas scrubber systems. In some areas, local regulations have gone as far as to prohibit the storage or use of arsine within municipal boundaries, or have required such elaborate safety systems as to make usage costs prohibitive. In other cases, individual company or academic safety policies have been written which have the same effect as local legislation; resultant prohibitive costs. A number of research individuals have also voluntarily refused to use arsine, due to a personal assessment of unnecessary risk. Although users of phosphine have not yet had to install such elaborate safety systems as with arsine, standard practices for phosphine usage are moving in this direction.

In silicon devices, it is often desired to dope during epitaxial growth with an n-type dopant. Typically, arsine is used during the in-situ doping step. Because of similar safety considerations as those for the GaAs semiconductor industry, silicon device manufacturers have been forced to move away from in-situ arsenic doping to post-epitaxial arsenic ion implantation. Arsine is electrically ionized under high voltage conditions forming ions of As, $As_2$, $As_3$, etc., and implanted through an ion accelerator into the silicon surface. An alternative to arsine in the ion implantation step is elemental arsenic (or elemental phosphorus for phosphorus implantation). However, the preferred materials remain arsine and phosphine, due to process logistics.

Diffusion of Group VA elements into silicon is used to form bases, emitters, resistors, source and drain regions, and doping of polycrystalline silicon. The Group VA element can be introduced into the silicon from diffusion of a chemical source in a vapor form at high temperatures, diffusion from a doped-oxide source, or diffusion and annealing from an implanted layer.

Researchers in the electronics field have examined using possible substitutes for arsine and phosphine. However, some compromises had to be made especially in attempts to effectively grow compound semiconductor material. Experimental focus has been on the peralkyl and alkyl hydrides of the Group V elements, e.g., trimethyl arsenic, dimethyl arsine, diethyl arsine, t-butyl arsine dihydride, t-butyl phosphine, and di-n-butyl phosphine, among others. Although the toxicities of these materials would be somewhat less than $AsH_3$ or $PH_3$, the hazard levels are seen to be much lower because they are not compressed gases. For instance, tert-butyl arsine (TBAS) has an $LC_{50}$ of 70 ppm in rats via inhalation, corresponding to an OSHA TLV/TWA ceiling limit of 0.5 $mg/m^3$, or roughly 80 ppb. This toxicity limit is almost on par with arsine itself, which has a TLV/TWA of 50 ppb. Because the material is a liquid with a boiling point of 69° C., the hazard level is seen to be much lower.

Carbon incorporation into grown films is a serious problem with these substitutes. The reasons for incorporation of carbon into an epitaxial compound semiconductor layer are twofold. Metal Group V carbon bonding is fairly stable to thermal decomposition, therefore requiring fairly high growth temperatures. The strength of this metal-carbon bond, even at these high temperatures, allows a fairly high surface concentration of methyl radicals to build up, which can be incorporated during epitaxial growth. Additionally, the methyl radicals can form stable surface complexes with both Group III and Group VA surface elements. Methyl radicals can eliminate hydrogen easily at these process temperatures, as this bond is the weak bond in the system for the Group III arsenides and/or phosphides, and incorporate the carbon into the compound semiconductor crystal lattice. Carbon preferentially incorporates into the Group VA element lattice site. Additionally, methyl radicals are adsorbed and desorbed in the boundary layer, leading to further migration and incorporation of carbon. Lowering the system pressure during growth drives the adsorption/desorption equilibrium towards desorption, lowering the amount of incorporated carbon somewhat. Trimethyl arsine has been documented as giving fairly severely carbon doped GaAs epitaxial films. Tert-butyl arsine has been used in attempts to minimize carbon incorporation, due to the stability of the tert-butyl organic fragment produced during pyrolysis. The t-butyl fragment is too sterically hindered to fit into the GaAs crystal lattice, giving less severely doped films. Additionally, the strong carbon-carbon bonds must be broken to incorporate carbon from this fragment. However, it is standard practice in the MOCVD growth of InSb to use trimethyl antimony as the Sb source, with few problems related to intrinsic carbon incorporation.

In the area of phosphorus doping for BPSG (borophosphosilicate glass), there are some commercially acceptable alternatives to phosphine, such as phosphorus oxychloride, or trimethyl phosphite, known as POCl and TMP, respectively, in the electronics industry. However, there are no arsenic sources, which could substitute for arsine in ASG (arseno-silicate glass) production that have found industry favor or utility.

The above-identified prior art sets forth the state of reactive deposition of Group III and Group V compounds for production of epitaxial layers and various doping applications of pre-existing layers and glasses. The prior art recognizes the drawbacks in the use of arsenic, phosphorus antimony and other metal complexes as reactant sources which have difficult transportation and storage, problematic purity maintenance, acute toxicity concerns, as well as contribution to impurity formation in the end product which are derived from such reactant sources. These problems of the prior art have been overcome by the improved processes of the present invention set forth below.

BRIEF SUMMARY OF THE INVENTION

The present invention is a method for the reactive deposition of a Group VA metal to a substrate using an organometallic reactant containing arsenic, phosphorus or antimony wherein the organometallic reactant is at least partially fluorinated, preferably perfluorinated.

More specifically, the organometallic reactant is selected from the group consisting of compounds of the formula: $MR_1R_2R_3$ wherein M=As, P or Sb and $R_1$, $R_2$ and $R_3$ are each separately hydrogen or are an organic radical wherein at least one R is an organic radical which is at least partially fluorinated.

In a preferred embodiment, the present invention is a method for the reactive deposition of a Group VA metal to a substrate, wherein the improvement comprises using a reactant selected from the group consisting of compounds of the formula:

$$M(C_nH_{[(2n+1)-x]}F_x)_{3-y}H_y$$

wherein M=arsenic, phosphorus or antimony; n=1-5; x has a value of $1 \leq X \leq 2n+1$; and $y \leq 2$. Preferably the reactant is tris-trifluoromethylarsenic, tris-trifluoromethylphosphorus or tris-trifluoromethylantimony. Other preferred reactants are tris-pentafluoroethyl arsenic, phosphorus or antimony.

More specifically, the present invention is a method of organometallic vapor phase epitaxial deposition of semi-conductor materials containing a Group VA metal using at least two reactants in which one of the reactants is an organometallic reactant containing arsenic, phosphorus or antimony wherein the organometallic reactant is at least partially fluorinated.

Specifically, in organometallic vapor phase epitaxy the organometallic reactant is selected from the group consisting of compounds of the formula: $MR_1R_2R_3$ wherein $M = As$, P or Sb and $R_1$, $R_2$, and $R_3$ are each separately hydrogen or an organic radical which is at least partially fluorinated.

A preferred embodiment of that aspect of the present invention is a method of organometallic vapor phase epitaxial deposition of semiconductor materials using two reactants, the improvement comprising using one of the reactants selected from the group consisting of compounds having a formula:

$$M(C_nH_{[(2n+1)-x]}F_x)_{3-y}H_y$$

wherein $M =$ arsenic, phosphorus or antimony; $n = 1$–$5$; x has a value of $1 \leq X \leq 2n+1$; and $y \leq 2$.

Preferably the organometallic vapor phase epitaxial deposition is performed with a reactant such as tris-trifluoromethylarsenic, tris-trifluoromethylphorphorous or tris-trifluormethylantimony. Other preferred reactants include tris-pentafluoroethyl arsenic, phosphorus or antimony.

Preferably the organometallic vapor phase epitaxial deposition is performed with a second reactant such as trialkyl gallium, trialkyl indium or trialkyl aluminum and more specifically trimethyl gallium, trimethyl indium, trimethyl aluminum or mixtures thereof. Also useful are triethyl gallium, aluminum and indium.

Another specific application of the present invention is a method of doping silicon dioxide-based glass or borosilicate-based glass with a Group VA metal using an organometallic dopant source containing arsenic, phosphorus or antimony wherein the organometallic dopant is at least partially fluroinated.

More specifically, the organometallic dopant source is selected from the group consisting of compounds of the formula $MR_1R_2R_3$ wherein $M = As$, P or Sb and $R_1$, $R_2$, and $R_3$ are each separately hydrogen or an organic radical wherein at least one R is an organic radical which is at least partially fluorinated.

A preferred embodiment of this application of the present invention is directed to a method of doping silicon dioxide or borosilicate-based glass with a Group VA metal, the improvement comprising using a dopant selected from the group consisting of compounds having the formula:

$$M(C_nH_{[(2n+1)-x]}F_x)_{3-y}H_y$$

wherein $M =$ arsenic, phosphorus or antimony; $n = 1$–$5$; x has a value of $1 \leq X \leq 2n+1$; and $y \leq 2$.

Preferably the dopant is tris-trifluoromethylarsenic, tris-trifluoromethylphorphorous or tris-trifluoromethylantimony. Other preferred dopants are tris-pentafluoroethyl arsenic, phosphorus or antimony.

Another specific aspect of the present invention is a method of n-type doping of silicon epitaxial or polycrystalline material with a Group VA metal using an organometallic dopant source containing arsenic, phosphorus, or antimony, wherein the organometallic dopant is at least partially fluorinated.

More specifically the organometallic dopant source is selected from the group consisting of compounds of the formula $MR_1R_2R_3$ wherein $M = As$, P or Sb and $R_1$, $R_2$ and $R_3$ are each separately hydrogen or an organic radical wherein at least one R is an organic radical which is at least partially fluorinated.

A preferred embodiment of this aspect of the present invention is directed to a method of n-type doping of silicon epitaxial material with a Group VA metal, the improvement comprising using a dopant selected from the group consisting of compounds having a formula:

$$M(C_nH_{[(2n+1)-x]}F_x)_{3-y}H_y$$

wherein $M =$ arsenic, phosphorus or antimony; $n = 1$–$5$; x has a value of $1 \leq X \leq 2n+1$; and $y \leq 2$.

Preferably the dopant is selected from tris-trifluoromethylarsenic, tris-trifluoromethylphosphorus or tris-trifluoromethylantimony. Other preferred dopants are tris-pentafluoroethyl arsenic, phosphorus or antimony.

A specific technique of the present invention is a method of ion implantation of a Group VA metal in a semi-conductor substrate using an organometallic ion source containing arsenic, phosphorus or antimony wherein said organometallic ion source is at least partially fluorinated.

More specifically, the organometallic ion source is selected from the group consisting of compounds of the formula $MR_1R_2R_3$ wherein $M = As$, P or Sb and $R_1$, $R_2$ and $R_3$ are each separately hydrogen or an organic radical wherein at least one R is an organic radical which is at least partially fluorinated.

A preferred embodiment of this technique of the present invention is a method of ion implantation of a Group VA metal in a semiconductor substrate, the improvement comprising using an ion source selected from the group consisting of compounds having the formula:

$$M(C_nH_{[(2n+1)-x]}F_x)_{3-y}H_y$$

wherein $M =$ arsenic, phosphorus or antimony; $n = 1$–$5$; x has a value of $1 \leq X \leq 2n+1$; and $Y \leq 2$.

Preferably the ion source is tris-trifluoromethylarsenic, tris-trifluoromethylphosphorus or tris-trifluoromethylantimony. Other preferred sources are tris-pentafluoroethyl arsenic, phosphorus or antimony.

A further aspect of the present invention is a method of diffusing a Group VA metal into an electronic material substrate from a vapor organometallic source to react the diffused metal to the substrate, wherein the improvement is the use of an organometallic source which is at least partially fluorinated.

Specifically the diffusion source is selected from the group consisting of compounds of the formula: $MR_1R_2R_3$ wherein $M = As$, P or Sb and $R_1$, $R_2$, and $R_3$ are each separately hydrogen or an organic radical wherein at least one R is an organic radical which is at least partially fluorinated.

A preferred embodiment of this application of the present invention is a method of diffusing a Group VA metal into an electronic material substrate from a vapor organometallic source to react the diffused metal to the substrate wherein the improvement comprises using a source selected from the group consisting of compounds having the formula:

$$M(C_nH_{[(2n+1)-x]}F_x)_{3-y}H_y$$

wherein M=arsenic, phosphorus or antimony; n=1-5; x has a value of $1 \leq X \leq 2n+1$; and $y \leq 2$.

Preferably the source is selected from tris-trifluoromethylarsenic, tris-trifluoromethylphosphorus or tris-trifluoromethylantimony. Other preferred sources are tris-pentafluoroethylarsenic, phosphorus or antimony.

A final aspect of the present invention is a method of chemical beam epitaxy for deposition and reaction of a Group VA metal with an electronic material substrate using a Group VA organometallic source wherein the improvement is the use of a Group VA organometallic source which is at least partially fluorinated.

Specifically the source is selected from the group consisting of compounds of the formula $MR_1R_2R_3$ wherein M=As, P or Sb and $R_1$, $R_2$, and $R_3$ are each separately hydrogen or an organic radical wherein at least one R is an organic radical which is at least partially fluorinated.

A preferred embodiment of this aspect of the present invention is a method of chemical beam epitaxy for deposition and reaction of a Group VA metal with an electronic material substrate wherein the improvement comprises using a source selected from the group consisting of compounds having the formula:

$$M(C_nH_{[(2n+1)-x]}F_x)_{3-y}H_y$$

wherein M=arsenic, phosphorus or antimony; n=1-5; x has a value of $1 \leq X \leq 2n+1$; and $y \leq 2$.

Preferably, the source is selected from tris-trifluoromethylarsenic, tris-trifluoromethylphosphorus, or tris-trifluoromethylantimony. Other preferred sources are tris-pentafluoroethylarsenic, phosphorus or antimony.

DETAILED DESCRIPTION OF THE INVENTION

At least partially fluorinated organometallics; compounds of the formula $MR_1R_2R_3$, wherein M=As, P or Sb and $R_1$, $R_2$, and $R_3$ are each separately hydrogen or an organic radical wherein at least one R is an organic radical which is at least partially fluorinated and such organic radicals are selected from the group consisting of alkyl, cycloalkyl, aryl, alkenyl or arenyl; or fluoroalkyl organometallics of the general formula:

$$M(C_nH_{[(2n+1)-x]}F_x)_{3-y}H_y$$

wherein M=arsenic, phosphorus or antimony; n=1-5; x has a value of $1 \leq X \leq 2n+1$; and $y \leq 2$, solve the problems of toxicity, source of contamination, high vapor pressure, and their effect on the physical properties of the corresponding compounds. Increasing the number of fluorines from 0 through $2n+1$ should result in systematic trends; decreasing toxicity with each additional fluorine, and increasing vapor pressure with each additional fluorine for any given alkyl fragment. The problem of intrinsic carbon incorporation decreases with certain structures due to steric hindrance, fragment chemical activity, and fragment stability of for example methyl vs. trifluoromethyl. The trifluoromethyl fragment is much less chemically reactive than a methyl fragment.

Previous solutions to finding alternatives to toxic arsine, phosphine and antimony compounds have focused on the alkyl metal organometallics. The distinguishing difference with the present invention is the use of fluoroalkyl organometallics to further lower toxicity and use hazard levels, as well as lowering of carbon contamination of the resulting end product. The fluoroalkyl organometallics of the present invention are also an advantage due to their high vapor pressures, steric hindrance, and fragment stability.

The present invention specifically addresses the uniquely beneficial properties of the fluoro-organometallic compounds $M(CF_3)_3$, $M(CF_2CF_3)_3$, or any $M(C_nF_{2n+1})_{3-y}H_y$ compound where (n=1-5), ($y \leq 2$), (M=As, P, Sb), $M(CH_2CF_3)_3$, any fluoroalkyl organometallics of the general formula $M(C_nH_{[(2n+1)-x]}F_x)_{3-y}H_y$ where n=1-5; $1 \leq X \leq 2n+1$; $y \leq 2$, M=As, P, or Sb, compounds of the formula $MR_1R_2R_3$ wherein M=As, P or Sb and $R_1$, $R_2$ and $R_3$ are each separately hydrogen or an organic radical wherein at least one R is an organic radical which is at least partially fluorinated. Specifically the organic radicals are selected from the group consisting of alkyl, cycloalkyl, aryl, alkenyl or arenyl, or at least partially fluorinated organometallics generally, and application of these materials to processes requiring reactive deposition of the corresponding element. These applications include a number of different reactive deposition processes; in organometallic vapor phase epitaxy (OMVPE) or chemical beam epitaxy of compound semiconductor materials such as GaAs, GaInAs, InP, InSb, etc., in doping of $SiO_2$ or borosilicate based glasses to enhance the reflow properties of the glass, for in-situ, n-type doping of silicon epitaxial material, or as a safe, less toxic source of arsenic or phosphorus for ion implantation or diffusion. Reactive deposition differs from simple elemental deposition in that the former results in a reacted or bonded metal rather than a mere surface or superficial metal layer achieved as in the latter simple elemental deposition.

Chemical vapour deposition (CVD) is an essential process in the fabrication of integrated circuits. The deposited layers fulfill many functions, and range, in chemical composition, from metals and alloys through to semiconductors and insulators. These materials provide conductive links within the device architecture, maintain electrical insulation between layers, or act as protective coatings during etching or subsequent processing. There is a close relationship between device physics, circuit design, the desired electrical properties of the layers and the chemistry underlying the deposition process.

In essence, CVD is a remarkably simple yet versatile technique in which the decomposition of a gaseous precursor, either homogeneously or heterogeneously, produces a solid thin film. Indeed, several reaction types have been utilized in semiconductor device fabrication and other coating applications. These include thermal decomposition, oxidation and reduction, hydrolysis and ammoniolysis, polymerization and processes which depend on physical mass transport. The microelectronics industry relies predominantly on thermal decomposition at high temperatures for the deposition of epitaxial silicon, polycrystalline and amorphous silicon, silicon dioxide and stoichiometric silicon nitride. The requirement for lower-temperature processing conditions has resulted in the development of plasma-enhanced CVD and photolytic CVD as a means of producing hydrogenated amorphous silicon and related alloys.

Historically, high-purity metals were prepared by CVD involving the corresponding metal halides, the technique stemming from the work of van Arkel and de Boer. The technology was subsequently applied to silicon by Holbing. Refinements of this process resulted in the so-called Siemens process in which uptrapure polycrystalline silicon is deposited on to thin silicon rods at 1000°–1200° C. from the reduction of $SiHCl_3$ in an $H_2$ diluent. The manufacture of polycrystalline silicon ingots represents the largest single application of CVD; subsequent crystal growth by the Czochralski or the Float Zone method produces the ubiquitous single-crystal silicon wafer.

Current CVD techniques for film growth have developed from processes carried out at atmospheric pressure using thermal heating for reactant dissociation. A number of variations have emerged with the obligatory, although non-standardized, acronyms. These are listed in Table 1.

TABLE 1

| Chemical Vapour Deposition (CVD) Techniques | | |
|---|---|---|
| Process | Acronym | Energy Source |
| Atmospheric pressure CVD | APCVD | Thermal |
| Low-pressure CVD | LPCVD | Thermal |
| Homogeneous CVD | HOMOCVD | Thermal |
| Metallo-organic CVD | MOCVD | Thermal |
| Plasma-enhanced CVD | PECVD | RF |
| Photolytic CVD | UVCVD | Photons |
| Laser CVD | LCVD | Photons |

The technology of these CVD processes encompasses a wide range of conditions of temperature, pressure and flow rates, each parameter being carefully controlled to produce uniform, coherent and defect-free films exhibiting reproducible characteristics. Substrate temperatures can be as low as 100° C. (PECVD) and may extend to above 1000° C. (APCVD). Process pressures range from atmospheric to c.0.05 Torr in some LPCVD applications. Traditional thermal dissociation techniques have been supplemented by the use of RF or photolytic excitation.

Whilst silicon processing is relatively well understood and the inherent advantages of silicon chemistry ensure its dominant position for some time, compound semiconductors are emerging as potential rivals for certain applications. The characteristics of Group III–V semiconductors, notably GaAs, have been known for some time. With the advent of metal-organic chemical vapour deposition, MOCVD, the importance of this technique to the growth of compound semiconductors has grown considerably.

The present invention's improvement in reactive deposition of the metal-organic vapor phase type deals with a technique for the growth of films on single-crystal substrate wafers which are treated chemically to act as a crystal 'template' for the continued growth of the crystal. Thus, to a first approximation, there is no change in the lattice of the semiconductor in moving through the interface. Other parameters, e.g. dopant concentration or type, may change at the interface producing heterostructures and heterojunctions, but the crystal structure is continuous. For instance, the growth of AlGaAs on GaAs is a heterojunction where the specific lattice sites differ, but the layers remain single crystalline. GaAs on silicon would be another, more extreme example of lattice mismatched heterostructures. This effect is called epitaxy, from the Greek epi (upon) and taxis (ordered).

This aspect of semiconductor growth leads to the first necessity of any growth technique: it must be capable of growing good-quality single-crystal material, with an interface epitaxially congruent with the substrate. Some mismatch can be tolerated, imparting strain into the grown single crystal material, i.e. GaAs on Si. For an elemental semiconductor with a diamond-like lattice, for example silicon, this involves growing the crystal without atoms missing from lattice sites (vacancies), or atoms in between their correct location in the lattice (interstitials), or with two planes of atoms not meeting correctly (dislocations). Compound semiconductors like gallium arsenide (GaAs) have a zinc blende structure, i.e. a diamond lattice with every alternate atom either gallium or arsenic. Growth of compound semiconductors may thus pose the additional problem of the crystal growing with gallium on the arsenic sublattice and vice-versa (antisite defects). With the addition of a third element to make a ternary alloy like aluminum gallium arsenide (AlGaAs) there are further complications to growing good-quality crystals.

The nomenclature of the film-growth technique is sometimes confused. The term "metal-organic chemical vapour deposition" (MOCVD) covers both the growth of epitaxial material and the growth of polycrystalline or metallic layers. On the other hand, "metal-organic vapour phase epitaxy" (MOVPE) is specific to the growth of single-crystal material.

MOVPE is part of a wider family of VPE (vapour-phase epitaxy) growth techniques which make use of the reactions occurring between the vapours of volatile chemical compounds when they are heated together. These reactions produce chemically active species that interact, either in the vapour phase or on a solid surface of the substrate to produce a corresponding epitaxial layer.

MOVPE specifically utilizes vapours from metal-organic compounds. (The term 'metal-organic' tends to be used to include organometallic compounds like metal alkyls, for instance trimethylgallium, and, more rarely, the metal alkoxides which have no metal-carbon bond and are therefore not strictly organometallic. Each alkyl is usually referred to as a four-letter acronym which includes the chemical symbol of the metal. Typical starting materials used to grow GaAs are trimethylgallium (TMGa) and arsine ($AsH_3$). These two compounds can react at 700° C. under hydrogen to produce epitaxial GaAs.

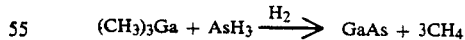

$$(CH_3)_3Ga + AsH_3 \xrightarrow{H_2} GaAs + 3CH_4$$

This reaction was first reported in 1968 and can be used as an illustration of a simple MOVPE reactor. Trimethylgallium is liquid at STP, and is held in a stainless steel bubbler where the bubbles of hydrogen become saturated with TMGa vapour; this vapour is then transported to the reaction cell. Gaseous $AsH_3$ is supplied either neat or diluted with hydrogen in a steel cylinder. The pressure is reduced to the reactor pressure (usually atmospheric but sometimes 77 Torr).

The two gas streams are intimately mixed and passed over a heated graphite block called a susceptor, which holds a GaAs single-crystal wafer.

Energy for heating the susceptor is usually provided by a high-power radiofrequency generator operating at about 450 kHz, but can also be supplied by resistance heating or infra-red lamps. TMGa and AsH$_3$ are heated in the reaction zone in the bounding layer of the susceptor and react to deposit GaAs. The growth of indium phosphide is similar, save that the carrier gas is sometimes helium or nitrogen or a combination of these with hydrogen.

Probably the most important aspect of material preparation in the semiconductor industry is obtaining source material of known (usually high) purity. In traditional areas of chemistry, materials or compounds of sufficient purity are readily obtainable by standard methods, but semiconductors are difficult to obtain with an acceptable purity. Dopants may be added in minute, controlled, amounts in order to impart desired electrical properties to the semiconductor; but this needs pure starting materials to be successful.

In real semiconductor materials, total purity is not possible; a crystal of 'pure' GaAs contains about $10^{23}$ atoms cm$^{-3}$ of which approximately $10^{13}$ would be impurities. A useful growth technique should be able to achieve this level of purity (less than 1 part per billion), which places stringent constraints on the purity of the starting materials.

Group VI elements in GaAs (e.g. S, Se, Te) replace As in the lattice, release electrons in the conduction band, and are n-type. Group II elements (Be, Mg, Zn, Cd) replace Ga, accept electrons, and are p-type. Group IV elements can behave amphoterically, becoming either n-type or p-type dopants, but generally carbon occupies arsenic sites and is a p-type dopant, and silicon occupies gallium sites and is an n-type dopant. When such elements are unavoidably present, they are known as n-type and p-type impurities; if added deliberately, they are dopants. Oxygen and transition metals behave as deep centres able to trap either electrons or holes.

After crystal quality and purity, the final important parameter in any growth technique is control of growth rate of the crystal in order to produce layers of uniform and reproducible thickness and to produce interfaces of suitable abruptness for the device in question. In the case of vapour-phase epitaxy this implies close control of the concentration of the reactants in the vapour phase.

MOVPE is used to grow compound semiconductors. These are more complicated to grow than elemental semiconductors (like silicon or germanium) but they have special properties that make them an increasingly important aspect of industrial semiconductor growth. The group of binary Group III–V semiconductors includes GaAs, InP and other combinations of Group III and V elements, e.g. AlSb, InSb, AlP, GaSb, AlAs and GaP. It is also possible to have different Group III elements on the same sub-lattice, e.g. aluminum gallium arsenide (AlGaAs), or to combine different Group V elements, e.g. gallium arsenide antimonide (GaAsSb), thus growing a ternary alloy. For some applications it is necessary to combine four elements into a quaternary semiconductor, e.g. indium gallium arsenide phosphide (InGaAsP). For ternary and quaternary Group III–V materials, the ability to vary the physical properties with alloy compositions is one of the factors which render these systems potentially useful in solid state electronics.

Incorporating dopant atoms into silicon and silicon-based electronic devices involves the same considerations as the Group III–V, MOCVD growth process requires, for example, mass transport and chemical reactions.

Typically, hydrides of the impurity atoms are used as the source of dopant. One might expect that these compounds would decompose spontaneously, but they do not. Thermodynamic calculations indicate that the hydrides are relatively stable because of the large volume of hydrogen present in the reaction. Typical of the dopant chemistry is the reaction for arsine, which shows arsine being absorbed on the surface, decomposing, and being incorporated into the growing layer. Interactions also take place between the doping process and the growth process. First, in the case of boron and arsenic the formation of chlorides of these species is a competing reaction. Second, the growth rate of the film influences the amount of dopant incorporated in the silicon. At low growth rates an equilibrium is established between the solid and the gas phase, which is not achieved at higher growth rates.

Ion implantation is a well-known and widely used process for injecting atoms into a solid material to selected depths and concentrations in selected areas. Ion implant accelerators are similar to isotope separators but typically have an added acceleration stage and field controls for precisely locating the beam of ions and controlling the energy and flux of the beam of ions to cause the desired penetration and concentration. Atoms of the selected chemical element to be ionized are ionized by collisions with electrons in an electrical discharge in a gas at low pressure and pass through an orifice into a high-vacuum region where they are accelerated by an electric field to an intermediate energy, typically from 10 to 30 KeV, where they are analyzed by a magnetic field based upon the e/m ratio, i.e. the ratio of electronic charge over mass. The selected ion beam passes through an analyzer slit, and the ions are accelerated to the desired energy, and the beam passes through a refocussing field, typically a quadrupole lens, is deflected by a scanner system, and collimated by a defined aperture and allowed to strike the target. When the ions penetrate the target lattice, they lose energy through collisions with lattice atoms and come to rest as part of the target. There are, of course, a large number of variations between specific ion implant systems but the foregoing principles apply generally to ion implant processes. The ion implant technique is described, inter alia, in U.S. Pat. Nos. 2,750,541, 2,787,564 and 2,842,466, which are incorporated herein. The ion implant method is also described in many texts, encyclopedias and scientific journals; see, e.g. ENCYCLOPEDIA OF SEMICONDUCTOR TECHNOLOGY, "Ion Implantation" pp. 397–410, John Wiley & Sons (1984) and the numerous references cited therein; see also, Kirk Othmer CONCISE ENCYCLOPEDIA OF CHEMICAL TECHNOLOGY, "Ion Implantation", p. 666 et seq., John Wiley & Sons (1985); and ION IMPLANTATION, J. K. Hirvonen, ed., Academic Press, Inc. (1980). Since the equipment and methods of ion implantation are so thoroughly described and widely used in the semiconductor industry, those skilled in the art are familiar with these methods and devices and may refer to any of the many excellent journal, text and patent descriptions for details. Manufacturer's manuals, provided with specific items of equipment are the best source for details as to a given piece of equipment.

Chemical beam epitaxy is another fabrication technique which can benefit from the present invention.

Unlike MOCVD, in which the chemicals reach the substrate surface by diffusing through a stagnant carrier gas boundary layer above the substrate, the chemicals in chemical beam epitaxy are admitted into a high vacuum growth chamber and impinge directly line of sight onto a heated substrate surface in the form of a molecular beam. In chemical beam epitaxy the desired reactant chemicals, metals such as As, P or Sb as well as Ga, Al and In are separately disassociated by heat and their respective vapor pressures drive them through a targeting device in the evacuated reaction chamber to the selected target for appropriate reaction.

The final specific technique to mention here which is benefited by the present invention is diffusion. In diffusion the diffusion source is typically heat decomposed over the substrate to be treated while the substrate itself is also heated. The source material provides elements such as arsenic, phosphorus or antimony which may have also been previously doped into the substrate. The heating process allows the source elements to diffuse into and diffuse by migration within the substrate to the appropriate lattice location. The substrate can be any electronic material such as glass, silicon, polysilicon, single crystal silicon or various specific electronic structures in such substrates.

Having described generally the applicable processes, it is appropriate to address the advantages of the compounds of the present invention used in such processes.

Fluorinated and perfluorinated organics and organometallics are known to have quite different properties than the corresponding perhydro compounds. For instance, trimethyl gallium (TMG) can be made via a number of different synthetic routes and is known to melt at $-15.8°$ C. and boil at $55.7°$ C. Tris(trifluoromethyl)gallium, on the other hand, is extremely difficult to produce, especially in useful quantities, and decomposes above ca. $-20°$ C. Most of the Group IIIA metal fluoroalkyls would be expected to behave similarly. In contrast, the Group VA fluoroalkyl compounds have been made (for research purposes only) in good yields, are fairly stable to the atmosphere, and based on knowledge of these fluorocarbon materials, should have markedly better toxicity characteristics than for arsine, e.g., >5 ppm TLV for tris-trifluoro methyl arsenic (TTFMAS) vs 0.05 ppm and 0.08 ppm TLV for $AsH_3$ and t-butyl arsine, respectively, due mainly to changes in chemical reactivity of the corresponding Group V compound resulting from the fluoroalkyl group.

An added benefit to the fluoroalkyl compounds is that the fluoroalkyl fragments are stable species, under normal conditions, due to a higher C-F bond energy compared to C-H. A fluoroalkyl ligand group on a Group V element lowers the M-C (M=As, P, Sb) bond energy compared to the M-C bond in a perhydroalkyl ligand compound especially for alkyl fragments of ethyl or higher. This lowering of the organometallic's bond strength leads to clean decomposition and few secondary gas phase or surface reactions, and possibly a lowered decomposition temperature, as compared to the corresponding perhydroalkyl organometallics.

Fluoroalkyl radicals tend to be fairly stable, so there would be little driving force to contaminate carbon into any epitaxial layer by inadvertent cleavage of fluorine, even under typical MOCVD process temperatures ($550°$-$750°$ C.). Additionally, regardless of growth temperature, the fluorocarbon fragments should not fit into the crystal lattice of any compound semiconductor material due to the added steric bulk imparted by the comparatively more bulky fluorines. Fluoroalkyl Group V hydrides can also be used in this scenario, although their toxicity characteristics would be nearer the perhydrides (arsine). Adding this hydride to the fluoroalkyl Group V compound might lead to chemicals which grow even better epitaxial material than, for example, TTFMAS, tris-pentafluoroethyl arsenic or other trisfluoroalkyl Group VA materials. This limitation of detrimental surface reactions, would be a product of beneficial recombinations of the hydride with fluoroalkyl fragments to form fluoroform ($CF_3H$), a highly stable molecule.

Additionally, these fluoroalkyl fragments should preferentially react with hydrogen which is typically an ambient gas in MOCVD, forming hydrogen radicals and fluoroform, $CF_3H$. Hydrogen radicals have been shown to actively etch certain Group III-V compound semiconductor materials. This etching mechanism would impart further processing advantages as an in-situ cleaning step. This mechanism is similar to the process which occurs during vapor phase epitaxy using gallium chloride and arsine. HCl is formed in-situ, which actively, and in a controlled fashion, etches the GaAs surface in a competing reaction with epitaxial growth. Etching preferentially occurs at crystal defect sites, whereas epitaxial growth preferentially occurs at single crystal sites, thus cleaning the surface of these defects during growth. It would be expected that the active hydrogen radicals, in coordination with the fluoroalkyl radicals would perform much the same function in the described OMVPE mechanism as does HCl in "chloride" vapor phase epitaxy. This hydrogen radical would also be available to react with other precursors (e.g., trimethyl gallium) present in an OMVPE reactor. Hydrogen as a carrier gas and ambient in the OMVPE system would limit the absolute need for any hydride, however.

Standard synthetic procedures normally used to make organometallic compounds, e.g., Grignard reagents or alkyl lithium reagents, are generally not acceptable for producing fluoroalkyl organometallics. The reaction of fluoroalkyl iodides with magnesium or lithium yields mainly magnesium fluoride or lithium fluoride, among other products. More direct methods have been used historically to produce $As(CF_3)_3$;

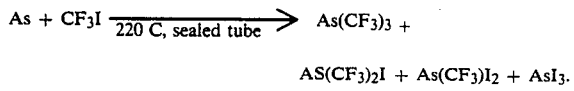

$$AS(CF_3)_2I + As(CF_3)I_2 + AsI_3.$$

This method can be generalized for any of the fluoroalkyl iodides. The side products can be reacted in a disproportionation

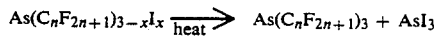

or be hydrogenated via a hydride transfer agent to other possibly useful products,

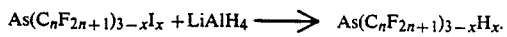

The preparation of fluoroalkyl organometallic Group V compounds could be generalized using the above methods to make all of the listed categories of products. The standard specific experimental procedure would follow, with some adaptations, the methods of Emeleus and Haszeldine, et al. set forth below:

EXAMPLE 1

Arsenic (50 g) and trifluoromethyl iodide (50 g) are heated in a stainless steel autoclave at 220° C. for a period of 18-24 hours. The volatile products are pumped off after cooling of the reactor to a suitable temperature (i.e., <40° C.). The majority of product is tris-trifluoromethyl arsine, with the remainder being bistrifluoromethyl arsenic iodide and trifluoromethyl arsenic diiodide. The boiling point of the tris-trifluoromethyl arsine is ca. 33° C.

Several additional experiments were conducted to examine process temperatures with reaction rate, product yield, and product mix. The optimal temperature found in our experiments is between 228° and 234° centigrade, with the optimal temperature being 232° C. Lower and higher temperatures resulted in poor yields of the desired product.

EXAMPLE 2

The trifluoromethyl arsine hydrides can be made via direct reaction of the tris-trifluoromethyl arsenic iodides with zinc and hydrochloric acid. For instance, 10 g of zinc, 10 ml of water, and 15 ml of 5N HCl are shaken with 3.80 g of iodo bis-trifluoromethylarsine to give 1.03 g of bistrifluoromethylarsine (b.p. 19° C.), a 43% yield. Trifluoromethylarsine can be made by a similar method (b.p. −12.5° C.).

EXAMPLE 3

GaAs can be grown using trimethyl gallium (TMG) and tris-trifluoromethyl arsenic (TTFMAS) in a hydrogen ambient. A bubbler of TMG is held at a temperature sufficient to impart a desired partial pressure in a typically hydrogen carrier gas flowing through the bubbler, although other carrier gases can be used such as nitrogen, helium, and argon. Temperatures used for TMG generally fall in the range of −15° C. to +20° C., with hydrogen flow rates through the bubbler between 5 $cm^3$-$min^{-1}$ to 100 $cm^3$-$min^{-1}$ for a single wafer MOCVD reactor. Typically an arsenic vapor source is combined with the vapor phase gallium source at Group V/III metal ratios anywhere from 1/1 to 200/1 arsenic (V)/gallium (III). Temperatures which have been used for the TTFMAS bubbler are −10° C. to 0° C. Carrier gas flow rates through the bubbler range from 1 sccm to 25 sccm. Generally, these organometallic/carrier gas mixtures are combined in the reactor, or in a pre-reactor mixing manifold, and additional carrier gas is added giving a total flow rate through the reactor of between 500 sccm to 10,000 sccm for a single wafer reactor. System pressure can range from vacuum to standard atmospheric pressure, but typically is in the range between 10 torr to 760 torr.

| Specific conditions used in a successful GaAs run were: | |
|---|---|
| As source temperature | −3.0° C. |
| Flow rate H2 through As source | 1.027 $cm^3$ $min^{-1}$ (sccm) |
| Partial pressure of Gallium source in reactor | 0.1 torr |
| Total flow rate of carrier in reactor | 1345 sccm |
| Group V/III metal ratio | 1.1/1.0 |
| Total system pressure | 300 torr |
| Reactor temperature | 670° C. |
| ESCA results | GaAs |
| Substrate | GaAs |

A typical exemplary group of Group VA organometallics useful in the present invention, but in no way considered a limitation on the scope of compounds, comprises: $As(C_6F_5)_3$; $As(CF_2CF_3)_3$; $As(CF_3)_3$; $As(CF_2CF_3)_2H$; $As(CF_2CF_3)H_2$; $As(CH_2CF_3)_3$; $As(CH_2CF_3)_2H$; $As(CF_3)_2H$; $As(CF_3)H_2$; $As(CF_2H)_2H$; $As(CF_2CF_3)$ $(CF_3)_2$ and $As(CF_3)$ $(CF_2CF_3)H$. Related compounds substituting phosphorus or antimony for the arsenic are also contemplated.

The major advantages which are afforded by the present invention are:

Lower Toxicity; the fluorinated and perfluorinated Group V organometallic compounds should have up to two orders of magnitude lower toxicity than the corresponding perhydro organometallics. For example, t-Butyl Arsine has a $LC_{50}$ of 70 ppm, which translates to an OSHA TLV/TWA of 0.08 ppm. This compares to arsine, which has a TLV/TWA of 0.05 ppm. It is estimated that a compound such as tris-trifluoromethyl arsine (TTFMAS) will have an $LC_{50}$ greater than 5000 ppm, and a TLV/TWA greater than 5 ppm. There is documentation that trimethyl arsine ($As(CH_3)_3$), or TMAs, has a $LC_{50}$ of ca. 20,000 ppm. It would be expected, given known trends and effects of fluorination, that tris-trifluoromethyl arsine ($As(CF_3)_3$) would be much less toxic than even TMAs.

Fast Reaction Kinetics and Clean Reaction Products; Compounds such as tris-trifluoromethyl arsine decompose cleanly and completely to metallic arsenic at lower temperatures than arsine. For instance, arsine pyrolyzes above ca. 700° C. The decomposition temperature of alkyl arsenicals is lower than that of arsine, but is still usually above ca. 500° C. In the case of tertiarybutyl arsine, initial decomposition begins at ca 350° C. The reaction mechanism produces $AsH_3$ in-situ, however, which generally decomposes homogeneously above 700° C. The fluoroalkylated organometallics generally decompose at even lower temperatures than the corresponding alkyls, due to the effects of fluorination on the internal stabilities of the metal carbon bonds. Tris-trifluoromethyl arsenic has been found from experiments in our laboratories to unimolecularly decompose in a nitrogen ambient at ca 520° C., but has also been observed to catalytically decompose heteromolecularly as low as 140° C. In the presence of hydrogen, fluoroform is the major gaseous carbon containing fragment, with hexafluoroethane making up the balance of gas phase reaction products. No $CO_2$ or $SiF_4$ was seen.

Price and Richard have calculated an activation energy for the decomposition of trimethyl arsine of 62.8 kcal/mole. Emeleus and Ayscough found activation energies for tris-trifluoromethyl arsine and tris-pentafluoroethyl arsine of 57.4 kcal/mole and 48 kcal/mole, respectively, showing that although TTFMAS has only slightly weaker metal to carbon bonding, as the alkyl chain length is lengthened, metal to carbon stability decreases dramatically.

Adding fluorines to an organometallic metal alkyl Group V compound will lower its boiling point and increase its vapor pressure at any given temperature. For example, trimethyl arsine ($As(CH_3)_3$) has a vapor pressure of 155 torr at 10° C., whereas tris-trifluoromethyl arsine has a vapor pressure at the same temperature of 350 torr. This high vapor pressure is of definite advantage to the process. It allows ample material (arsenic) to be delivered to a surface without extreme source temperatures, or the necessity of heat tracing process gas lines. Fluorination of any of the Group V metal organometallics would have the same effect of increasing the volatility at any given temperature, as compared to the corresponding perhydro organometallics.

The major applications where fluoroalkyl Group V compounds can be used to advantage are:

The MOCVD growth of GaAs, AlGaAs, InGaAsP, InP, InSb, and related compound semiconductor materials, as highly volatile, low toxicity source of arsenic, phosphorus, and/or antimony. For example, the growth of GaAs using trimethyl gallium and arsine requires growth temperatures between 600° and 680° C. Process temperatures below ca. 600° result in GaAs films of poor morphology, probably due to poor reaction kinetics of the arsine. An excess of arsine is required for growth, with ratios of $AsH_3$ to Group III metal alkyl usually greater than 20 and often greater than 50. There is documentation that good morphology GaAs can be grown at 550° C. using diethyl arsine at a III/V ratio of 1, which is most likely due to the lower decomposition temperature of the arsenic source (the toxicity of DEAS should be similar to the toxicity of TBAS, with roughly a $LC_{50}=100$ ppm and TLV=0.1 ppm). Tert-butyl arsine is also known to be pyrophoric in air, but tris-trifluoromethyl arsine is air and water stable. Tris-trifluoromethyl phosphine, however, is oxygen sensitive, and will spontaneously combust in air.

Fluoroalkyl organometallic compounds of the type $M(C_nF_{2n+1})_3$, where n=1-5 and M=As, P or Sb, would be non-toxic sources for n-type doping of silicon for electronics applications. The $[C_nF_{2n+1}]$ fragments would be non-detrimental to the process, and should form $[C_nF_{2n+1}]H$ upon reacting with silane or disilane.

Fluoroalkyl organometallic compounds of the type $M(C_nF_{2n+1})_3$, where n=1-5 and M=As, P or Sb, would be less toxic sources for arsenic and phosphorus doping of arsenosilicate glass, and phosphosilicate or borophosphosilicate glasses, respectively. Doping with these Group V elements enhances the reflow properties for the respective glasses. Although there are alternatives to phosphine in PSG and BPSG glasses, there are currently no industry accepted alternatives to arsine for ASG glass production.

Fluoroalkyl organometallic compounds of the above type would be ideal sources of arsenic, phosphorus and antimony as diffusion sources in normal high temperature diffusion applications. Diffusion of the dopant source into silicon or other electronic materials would be used, among others, to form doped polysilicon interconnections, doped metal silicide gate structures, and heavily doped ohmic contact areas.

Fluoroalkyl organometallic compounds of the type $M(C_nF_{2n+1})_3$, where n=1-5 and M=As, P or Sb, would be ideal less toxic sources of arsenic and phosphorus in ion implant applications. Currently, the source materials of choice are arsine, phosphine, and elemental arsenic or phosphorus among others. Although users would prefer the hydrides (e.g. arsine) because of the logistics of continuous processing, many have moved to using plug-in modules of elemental arsenic or phosphorus for implanting sources due to toxicity and hazard issues related to use of the compressed gas hydrides. The fluoroalkyl Group V compounds would be easily cracked into their respective elements and accelerated in quadrupole separators. Continuous processing could be accomplished. These liquid sources could be easily changed out, just as with compressed gases, with little or no system contamination or downtime.

The present invention has been set forth with descriptions of several preferred embodiments, however the scope of the invention should be ascertained from the claims which follow.

We claim:

1. In a method of n-type doping of silicon epitaxial or polycrystalline material with a Group VA metal using an organometallic dopant source containing arsenic, phosphorus or antimony, the improvement wherein said organometallic dopant is selected from the group consisting of compounds of the formula:

$MR_1R_2R_3$ wherein M=As, P or Sb and $R_1$, $R_2$ and $R_3$ are each separately hydrogen or an organic radical wherein at least one R is an organic radical which is at least partially fluorinated.

2. The method of claim 1 wherein said organic radicals are selected from the group consisting of alkyl, cycloalkyl, aryl, alkenyl or arenyl.

3. The method of claim 1 wherein said organometallic dopant source is selected from the group consisting of compounds having the formula:

$M(C_nH_{[(2n+1)-x]}F_x)_{3-y}H_y$ wherein

M=As, P or Sb;

n=1-5;

x has a value; $1 \leq x \leq 2n+1$; and $y \leq 2$.

4. The method of claim 1 wherein said organometallic dopant source is selected from the group consisting of compounds having the formula:

$M(C_nF_{(2n+1)})_{3-y}H_y$ wherein:

M=As, P or Sb;

n=1-5; and $y \leq 2$.

5. The method of claim 1 wherein said organometallic dopant source is selected from the group consisting of compounds having the formula:

$M(C_nF_{(2n+1)})_3$ wherein

M=As, P or Sb and n=1-5.

6. The method of claim 1 wherein said organometallic dopant source is tris-trifluoromethyl arsenic.

7. The method of claim 1 wherein said organometallic dopant source is tris-trifluoromethyl phosphorus.

8. The method of claim 1 wherein said organometallic dopant source is tris-trifluoromethyl antimony.

9. In a method of ion implantation of a Group VA metal in a semiconductor substrate using an organometallic ion source containing arsenic, phosphorus or antimony, the improvement wherein said organometallic ion source is selected from the group consisting of compounds of the formula:

$$MR_1R_2R_3$$

wherein $M=As$, P or Sb and $R_1$, $R_2$ and $R_3$ are each separately hydrogen or an organic radical wherein at least one R is an organic radical which is at least partially fluorinated.

10. The method of claim 9 wherein said organic radicals are selected from the group consisting of alkyl, cycloalkyl, aryl, alkenyl or arenyl.

11. The method of claim 9 wherein said organometallic ion source is selected from the group consisting of compounds having the formula:

$$M(C_nH_{[(2n+1)-x]}F_x)_{3-y}H_y$$

wherein $M=As$, P or Sb;

$n=1-5$;

x has a value; $1 \leq x \leq 2n+1$; and $y \leq 2$.

12. The method of claim 9 wherein said organometallic ion source is selected from the group consisting of compounds having the formula:

$$M(C_nF_{(2n+1)})_{3-y}H_y$$

wherein:

$M=As$, P or Sb;

$n=1-5$; and $y \leq 2$.

13. The method of claim 9 wherein said organometallic ion source is selected from the group consisting of compounds having the formula:

$$M(C_nF_{(2n+1)})_3$$

wherein $M=As$, P or Sb and $n=1-5$.

14. The method of claim 9 wherein said organometallic ion source is tris-trifluoromethyl arsenic.

15. The method of claim 9 wherein said organometallic ion source is tris-trifluoromethyl phosphorus.

16. The method of claim 9 wherein said organometallic ion source is tris-trifluoromethyl antimony.

* * * * *